United States Patent [19]
Mistretta et al.

[11] Patent Number: 5,830,143
[45] Date of Patent: Nov. 3, 1998

[54] GATED TIME-RESOLVED CONTRAST-ENHANCED 3D MR ANGIOGRAPHY

[75] Inventors: Charles M. Mistretta; Frank R. Korosec; Thomas M. Grist; Richard Frayne, all of Madison, Wis.

[73] Assignee: Wisconsin Alumnin Research Foundation, Madison, Wis.

[21] Appl. No.: 787,181

[22] Filed: Jan. 21, 1997

[51] Int. Cl.⁶ .................................................. H61B 5/055
[52] U.S. Cl. ........................ 600/420; 334/309; 334/306
[58] Field of Search .................................. 600/410, 413, 600/420, 431, 419; 324/307, 309, 306

[56] References Cited

U.S. PATENT DOCUMENTS

| | | | |
|---|---|---|---|
| 4,204,225 | 5/1980 | Mistretta | 358/111 |
| 4,204,226 | 5/1980 | Mistretta | 358/111 |
| 4,830,012 | 5/1989 | Riederer | 128/653 |
| 5,125,407 | 6/1992 | Harms et al. | 324/309 |
| 5,166,875 | 11/1992 | Machida | 364/413.13 |
| 5,320,099 | 6/1994 | Roberts et al. | 324/306 |
| 5,348,011 | 9/1994 | NessAiver | 128/653.2 |
| 5,377,680 | 1/1995 | Bernstein et al. | 128/653.2 |
| 5,417,213 | 5/1995 | Prince | 128/655.3 |
| 5,429,134 | 7/1995 | Foo | 600/410 |
| 5,435,303 | 7/1995 | Bernstein et al. | 600/419 |
| 5,474,067 | 12/1995 | Laub | 600/410 |
| 5,522,390 | 6/1996 | Tuithof et al. | 600/410 |
| 5,553,619 | 9/1996 | Prince | 128/653.4 |

FOREIGN PATENT DOCUMENTS

| | | |
|---|---|---|
| 0 599 456 A1 | 6/1994 | European Pat. Off. |
| 43 17 028 A1 | 11/1994 | Germany |
| WO 96/35130 | 11/1996 | WIPO |

OTHER PUBLICATIONS

Simultaneous Multislice Rapid (SMR) Flash MRI with Hard Pulse Excitation, Journal of Magnetic Resonance, Series B 111, 289–295 (1996), Singh, et al.

Real–Time Position Monitoring of Invasive Devices Using Magnetic Resonance, MRM 29:411–415 (1993), Dumoulin, et al.

Dynamic MR Digital Subtraction Angiography Using Contrast Enhancement, Fast Data Acquistion, and Complex Subtraction, MRM 36:551–556 (1996), Wang, et al.

International Search Report, PCT/ISA/210, dated 2 Feb. 1998, Issued by European Patent Office, Officer Volmer, W.

*Improved Ejection Fraction and Flow Velocity Estimates with Use of View Sharing and Uniform Repetition Time Excitation with Fast Cardiac Techniques,* Radiology 1995: 195:471–478, Foo et al.

*Block Regional Interpolation Scheme for k–Space (BRISK): A Rapid Cardiac Imaging Technique,* MRM 33:163–170 (1995), Doyle, et al.

*Breath–hold Cine MR Imaging with a Shared and Reordered Gradient Echo Technique,* Siemens Medical Engineering, Erlangen, Germany, p. 478.

*MR Fluoroscopy: Technical Feasibility,* MRM 8, 1–15 (1988), Riederer, et al.

(List continued on next page.)

*Primary Examiner*—Brian Casler
*Attorney, Agent, or Firm*—Quarles & Brady

[57] ABSTRACT

A dynamic MRA study of a subject is performed using a 3D fast gradient-recalled echo pulse sequence that employs a non-selective RF excitation pulse. The frame rate of the resulting series of reconstructed images is increased by sampling a central region of k-space at a higher rate than the peripheral regions of k-space. The acquisition is gated using a cardiac trigger signal and the central region of k-space is acquired during diastole and the peripheral regions of k-space are acquired during systole. Image frames are reconstructed at each sampling of the central k-space region using the temporally nearest samples from the peripheral k-space regions. Two of the image frames are subtracted to form an MR angiogram.

13 Claims, 5 Drawing Sheets

OTHER PUBLICATIONS

*Method for Accelerated Perfusion Imaging,* van Vaals, et al., p. 1139.

*Simulation of Spatial and Contrast Distortions in Keyhole Imaging,* MRM 31:320–322 (1994), Spraggins.

Paper by: J.O. Frederickson & N.J. Pelc, Dept. of Radiology, Stanford University, Stanford CA.

*Dynamic Gadolinium–enhanced Three–dimensional Abdominal MR Arteriography,* JMRI 1993: 3:877–881, vol. 3, No. 6, Prince et al.

*Dynamic, contrast enhanced, NMR perfusion imaging of regional cerebral ischaemia in rats using k space substitution,* Jones et al., p. 1138.

*Reduction of Field of View for Dynamic Imaging,* MRM 31:691–694 (1994), Hu et al.

*K–Space Substitution: A Novel Dynamic Imaging Technique,* MRM 29:830–834 (1993), Jones et al.

*Dynamic Susceptibility Contrast Imaging Using A Gradient–Echo Sequence,* Radiology Science Lab, Dept. of Radiology, Stanford CA, Pike, et al.

*Real–Time MR Fluoroscopic Data Acquisition and Image Reconstruction,* MRM 12, 407–415 (1989), Wright et al.

*Continuous Update with Random Encoding (CURE): A New Strategy for Dynamic Imaging,* MRM 33:326–336 (1995), Parrish, et al.

*New Strategies in Spiral MR Fluoroscopy,* Dept. of Electrical Engineering, Stanford University, Stanford CA, Keer, et al.

Paper by: J. Polzin, et al., Dept. of Medical Physics & Radiology, University of Wisconsin, Madison WI.

*MR Smart Prep,* p. 453, Thomas K.F. Foo, et al.

*Time–Resolved Contrast–Enhanced 3D MR Angiography,* MRM 36:345–51 (1996) F.R. Korosec, et al.

GATED TIME-RESOLVED CONTRAST-ENHANCED 3D MR ANGIOGRAPHY

This invention was made with U.S. Government support awarded by the National Institutes of Health (NIH) Grant Nos.: HL02848 and HL51370. The U.S. Government has certain rights in this invention.

BACKGROUND OF THE INVENTION

The field of the invention is magnetic resonance angiography ("MRA"), and particularly, dynamic studies of the human vasculature using contrast agents which enhance the NMR signals.

Diagnostic studies of the human vasculature have many medical applications. X-ray imaging methods such as digital subtraction angiography ("DSA") have found wide use in the visualization of the cardiovascular system, including the heart and associated blood vessels. Images showing the circulation of blood in the arteries and veins of the kidneys and the carotid arteries and veins of the neck and head have immense diagnostic utility. Unfortunately, however, these x-ray methods subject the patient to potentially harmful ionizing radiation and often require the use of an invasive catheter to inject a contrast agent into the vasculature to be imaged.

One of the advantages of these x-ray techniques is that image data can be acquired at a high rate (i.e. high temporal resolution) so that a sequence of images may be acquired during injection of the contrast agent. Such "dynamic studies" enable one to select the image in which the bolus of contrast agent is flowing through the vasculature of interest. Earlier images in the sequence may not have sufficient contrast in the suspect vasculature, and later images may become difficult to interpret as the contrast agent reaches veins and diffuses into surrounding tissues. Subtractive methods such as that disclosed in U.S. Pat. No. 4,204,225 entitled *"Real-Time Digital X-ray Subtraction Imaging"* may be used to significantly enhance the diagnostic usefulness of such images.

Magnetic resonance angiography (MRA) uses the nuclear magnetic resonance (NMR) phenomenon to produce images of the human vasculature. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_y$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals, are digitized and processed to reconstruct the image using one of many well known reconstruction techniques.

Most NMR scans currently used to produce medical images require many minutes to acquire the necessary data. The reduction of this scan time to seconds rather than minutes is the major obstacle in performing clinical dynamic studies using MRI methods. A number of methods have been developed to increase the temporal resolution of MRI scans using pulse sequences that are applicable to MRA. In a method known in the art as "MR fluoroscopy" and described in U.S. Pat. No. 4,830,012, the subject is scanned by continuously and repeatedly acquiring the N phase encoding views needed for a complete image. Rather than waiting for an entirely new set of N views before reconstructing the next image, however, images are reconstructed at a much higher rate by using the most recent N views. In other words, an image is reconstructed from newly acquired views as well as views used in reconstructing previous images in the dynamic study. While very high temporal rates are achieved with MR fluoroscopy, the image contrast is not satisfactory for MRA because the central views in k-space, which dominate the overall image contrast, are still updated at the much slower inherent scan rate (i.e. NxTR).

Another method for increasing temporal resolution of MRI images is referred to in the art as "keyhole" imaging. As described, for example, by R. A. Jones, et al. in *"Dynamic, Contrast Enhanced, NMR Perfusion Imaging Of Regional Cerebral Ischaemia In Rats Using K-Space Substitution"*, SMR Eleventh Annual Meeting 1992 abs. 1138, a sequence of images is acquired during a dynamic study in which a contrast agent is injected in the subject. The first image in the sequence is a reference image in which all the phase encoding views (e.g. 128 views) are acquired. Subsequent images are produced, however, by only acquiring the central views (e.g. the central 32 views). These keyhole scans can obviously be acquired much faster than complete scans and the temporal rate is increased proportionately. The keyhole images are reconstructed using the most recent central k-space views combined with the outer, peripheral k-space views from the reference scan. Unfortunately, in situations where the low spatial frequency changes in the reconstructed images do not capture the evolution of the dynamic study, k-space keyhole imaging is not appropriate. This is a problem when contrast changes in small regions are to be studied, and in such studies the number of central views acquired must be increased to the point where the gain in temporal resolution is lost.

Related to the k-space keyhole imaging method is a method known in the art as limited field of view ("FOV") dynamic imaging. As described, for example, by Hu and Parrish, published in *Magnetic Resonance in Medicine*, Vol. 31, pp. 691–694, 1994, and by Frederickson and Pelc, 3rd SMR, 1, 197.1995; this method is applied to dynamic studies in which the changing part of the image occupies no more than one half the full FOV. A reference image representing the static part of the image is produced at the beginning of the study and a series of images encompassing only the dynamic, central portion of the image are produced using half the number of phase encoding views. These dynamic images can be acquired at a higher temporal rate because only half the number of views (either the odd or even views) need be acquired. The dynamic and static portions of the image are combined to produce a corresponding series of full FOV images. Of course, if changes occur in the static portion of the image, the information obtained from these regions will no longer accurately remove artifacts aliased into the small FOV.

MR angiography (MRA) has been an active area of research. Two basic techniques have been proposed and evaluated. The first class, time-of-flight (TOF) techniques, consists of methods which use the motion of the blood relative to the surrounding tissue. The most common approach is to exploit the differences in signal saturation that exist between flowing blood and stationary tissue. This is know as flow-related enhancement, but this effect is misnamed because the improvement in blood-tissue contrast is actually due to the stationary tissues experiencing many excitation pulses and becoming saturated. Flowing blood, which is moving through the excited section, is continually refreshed by spins experiencing fewer excitation pulses and is, therefore, less saturated. The result is the desired image contrast between the high-signal blood and the low-signal stationary tissues.

MR methods have also been developed that encode motion into the phase of the acquired signal as disclosed in Re. U.S. Pat. No. 32,701. These form the second class of MRA techniques and are known as phase contrast (PC) methods. Currently, most PC MRA techniques acquire two images, with each image having a different sensitivity to the same velocity component. Angiographic images are then obtained by forming either the phase or complex difference between the pair of velocity-encoded images. Phase contrast MRA techniques have been extended so that they are sensitive to velocity components in all three orthogonal directions.

Despite the tremendous strides made in recent years, at many clinical sites MRA is still considered a research tool and is not routinely used in clinical practice. More widespread application of either TOF or PC techniques is hampered by the presence of a variety of deleterious image artifacts, which can mask and, in some cases, even mimic pathology. These artifacts generally result in a lower specificity, as well as compromised sensitivity.

To enhance the diagnostic capability of MRA a contrast agent such as gadolinium can be injected into the patient prior to the MRA scan. As described in U.S. Pat. No. 5,417,213 the trick is to acquire the central k-space views at the moment the bolus of contrast agent is flowing through the vasculature of interest. This is not an easy timing to achieve as part of a routine clinical procedure.

Another challenge is presented when blood vessels such as the aorta, renal arteries and pulmonary arteries are to be imaged. These vessels move significantly during the cardiac cycle as a result of the changing blood flow rate. To minimize the ghosting and blurring caused by such motion, it is common practice to gate the data acquisition using an ECG signal. When ECG gating is used, the acquisition of NMR data is timed to occur only during the diastolic phase of the cardiac cycle. As a result, during at least one third of the time no data is being acquired and the total time to complete a scan is typically increased by 50%. In a dynamic study, this translates to a corresponding reduction in the temporal frame rate, and a consequent reduction in the probability that the procedure can be timed to achieve maximum image contrast.

SUMMARY OF THE INVENTION

The present invention is a method for increasing the temporal rate at which MRI images can be acquired during a gated dynamic study. More specifically, the method includes repeatedly acquiring samples from a selected k-space during a dynamic study, in synchronization with the subject's cardiac cycle, sampling a central region of the selected k-space during the diastolic portion of each cardiac cycle, sampling peripheral k-space regions during the systolic portion of each cardiac cycle, forming a data set for each set of central region k-space samples which includes the central region k-space samples and samples derived from temporally adjacent samplings of the peripheral k-space regions, and reconstructing an MRI image from each of the data sets to produce a sequence of images at the higher temporal rate. The samples in each data set for peripheral k-space regions may be derived simply by selecting the corresponding k-space samples acquired closest in time to the acquisition of the central region k-space samples, or they may be derived by interpolating between corresponding k-space samples acquired before and after the acquisition of the central region k-space samples.

A general object of the invention is to increase the temporal rate at which MRI images can be produced during a cardiac gated dynamic study without reducing their diagnostic value. By sampling the central k-space region during the diastolic portion of the cardiac cycle and at a higher temporal rate, the dynamic changes in contrast of the larger objects in the subject are more accurately depicted and more finely resolved. Using a lower sampling rate for the peripheral k-space regions substantially reduces the amount of data to be acquired per image frame without significantly reducing the diagnostic value of the reconstructed image. In addition, by acquiring the peripheral k-space samples during systole, data is acquired during the entire cardiac cycle, thus further increasing the rate at which k-space is sampled. The advantages are particularly pronounced with 3D acquisitions.

Another object of the invention is to provide a method in which the temporal rate can be further increased by eliminating selective excitation pulses. The final angiogram is produced by subtracting two data sets acquired at different times during the dynamic study. This subtraction removes aliasing artifacts normally associated with 3D imaging. As a result, the slab-select RF excitation pulse normally used to eliminate such artifacts is not needed, and a much shorter non-selective RF excitation pulse may be used. This enables the pulse sequence to be shortened, which in turn enables the temporal frame rate to be further increased.

Another object of the invention is to provide a method in which the temporal rate can be increased by interpolating between successive data sets. The basic frame rate is determined by the rate at which the central k-space region is sampled. This can be increased by interpolating between successive samples of the central k-space region to form additional image frames.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
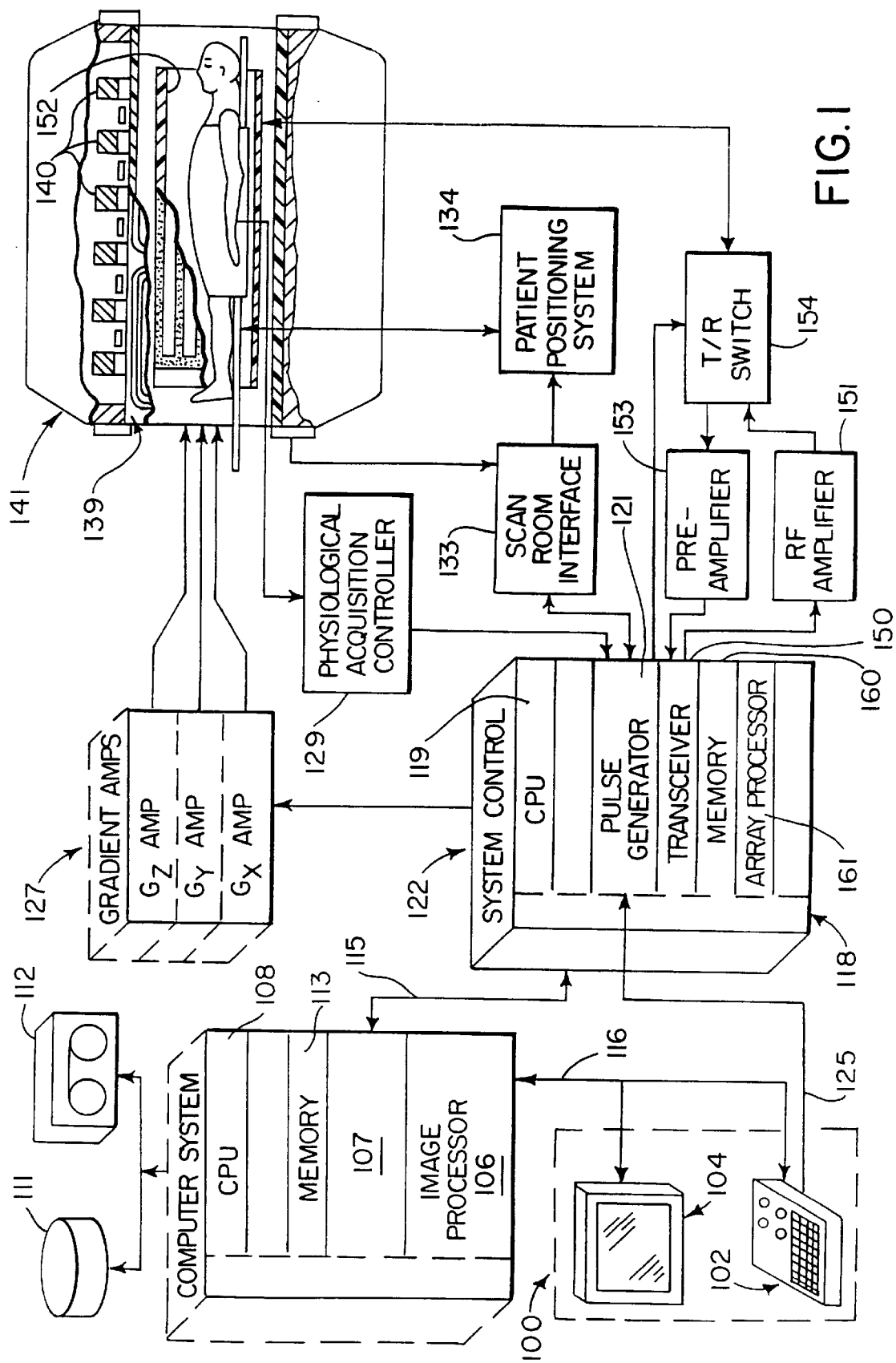
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
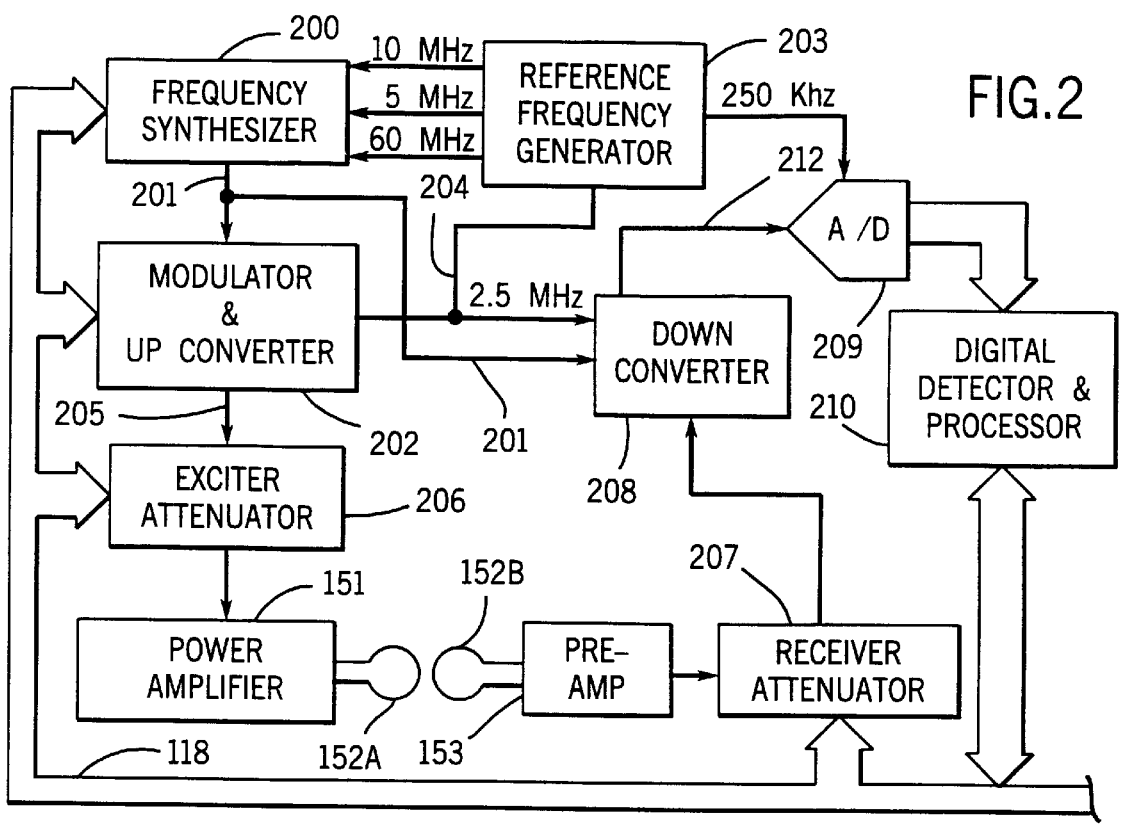
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
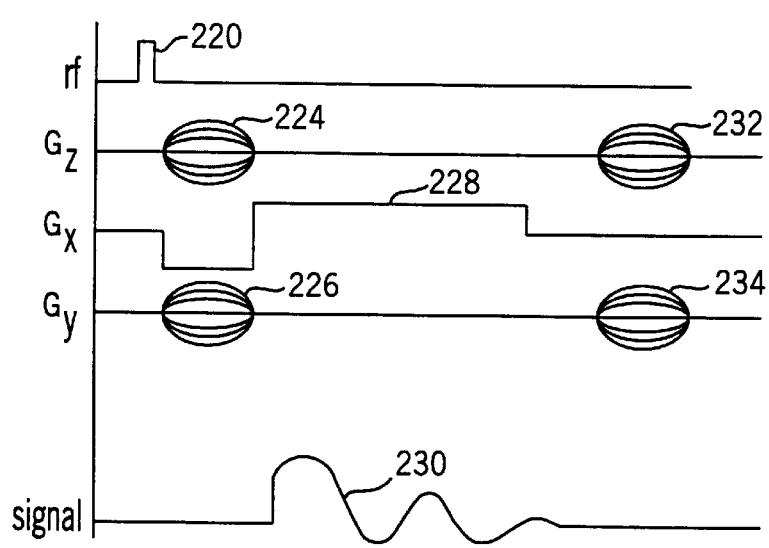
FIG. 3 is a graphic representation of the pulse sequence employed in the preferred embodiment of the invention.

Although the present invention can be used with a number of different pulse sequences, the preferred embodiment of the invention employs a 3D gradient recalled echo pulse sequence depicted in FIG. 3. The pulse sequence "3dfgre" available on the General Electric 1.5 Tesla MR scanner sold under the trademark "SIGNA" with revision level 5.5 system software was used. It was modified to use a non-selective RF pulse, as will be described below, and it was modified to collect data from a single volume multiple times so that the k-space sampling patterns taught by the present invention can be practiced.

Referring particularly to FIG. 3, a non-selective RF excitation pulse 220 having a flip angle of 60° is applied to produce transverse magnetization. This is followed by a phase encoding gradient pulse 224 directed along the z axis and a phase encoding gradient pulse 226 directed along the y axis. A readout gradient pulse 228 directed along the x axis follows and a partial echo (60%) NMR signal 230 is acquired and digitized as described above. After the acquisition, rewinder gradient pulses 232 and 234 rephase the magnetization before the pulse sequence is repeated as taught in U.S. Pat. No. 4,665,365.

One aspect of the present invention is the recognition that a selective RF excitation pulse and associated slab select gradient are not required. Thus, instead of using a selective RF pulse that requires more time to play out, a much shorter non-selective pulse may be used. This translates to a reduction in the TR of the pulse sequence, which in turn translates to a corresponding reduction in total scan time and increase in temporal frame rate.

Figure 5:
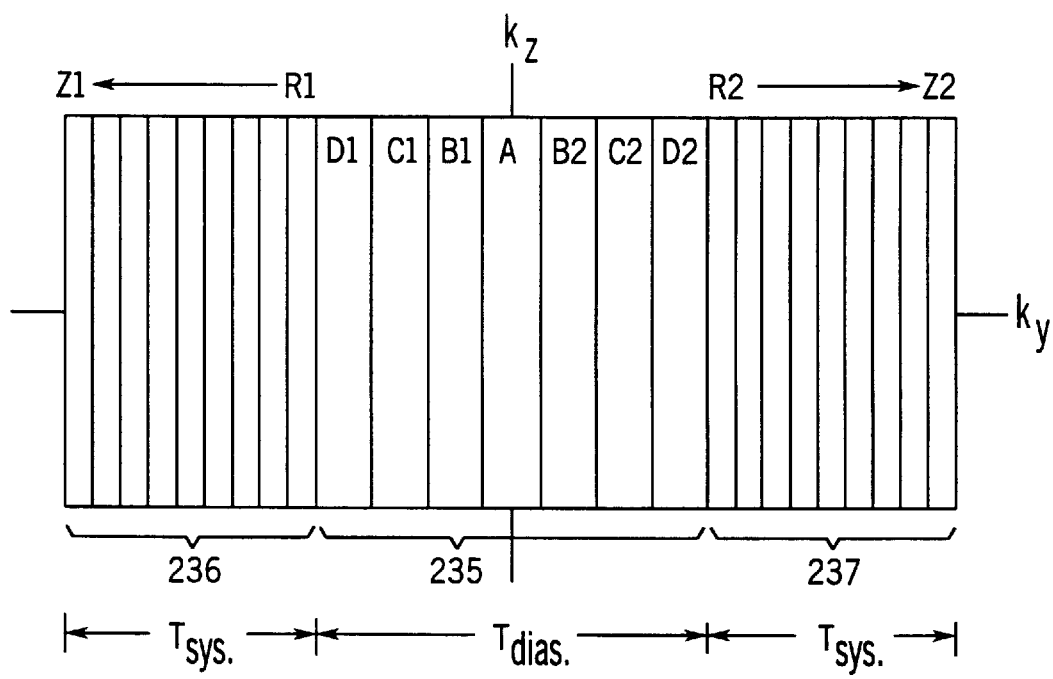
FIG. 5 is a graphic representation of three-dimensional k-space from which data is sampled when practicing the preferred embodiment of the invention.

As is well known in the art, the pulse sequence in FIG. 3 is repeated and the phase encoding pulses 224 and 226 are stepped through a series of values to sample the 3D k-space depicted in FIG. 5. In the preferred embodiment eight phase encodings are employed along the z axis and 128 phase encodings are employed along the y axis. For each particular y phase encoding, therefore, eight acquisitions with eight different z phase encodings are performed to sample completely along the $k_z$ axis. This is repeated 128 times with 128 different y phase encodings to sample completely along the $k_y$ axis. As will become apparent from the discussion below, the order in which this sampling is performed is an important aspect of the present invention.

Sampling along the $k_x$ axis is performed by sampling the echo signal 230 in the presence of the readout gradient pulse 228 during each pulse sequence. It will be understood by those skilled in the art that only a partial sampling along the $k_x$ axis is performed and the missing data is computed using a homodyne reconstruction or by zero filling. This enables both the echo time (TE) and the pulse repetition rate (TR) to be shortened. In the preferred embodiment 312 samples of the fractional echo 230 are acquired along $k_x$.

Referring particularly to FIG. 5, to perform a dynamic study according to the present invention the k-space to be sampled is divided into regions. In the preferred embodi-
ment the 3D k-space is divided into two regions, a central region 235 and a peripheral region indicated at 236 and 237. Each of these are in turn divided into twenty-five subregions. The central region 235 contains seven subregions labelled A, $B_1$, $C_1$, $D_1$, $B_2$, $C_2$, and $D_2$, each of which requires 64 separate acquisitions (i.e. 8 $k_z$ phase encodings at 8 different $k_y$ phase encodings). The peripheral region of k-space indicated at 236 and 237 contains eighteen peripheral subregions labelled R1 through Z1 and R2 through Z2. Each of these peripheral subregions requires 32 separate acquisitions (i.e., 8 $k_z$ phase encodings at 4 different $k_y$ phase encodings. As is well known in the art, the samples from the central regions of k-space contain most of the information which determines the overall contrast in the reconstructed image. As will be described below, it is a teaching of the present invention that these central regions of k-space be acquired more frequently during the dynamic study and that they be acquired during the diastolic phase of the cardiac cycle. It is the central k-space subregion A which forms the basis for each frame image in the dynamic study and which determines the eventual temporal frame rate.

It can be appreciated by those skilled in the art that k-space can be carved up in other ways to practice the present invention. For example, the number of subregions can be changed and they can be oriented such that their boundaries are disposed along the slice-select $k_z$ axis. Also, k-space can be divided into a circular central region and a surrounding, annular-shaped peripheral region.

Figure 4:
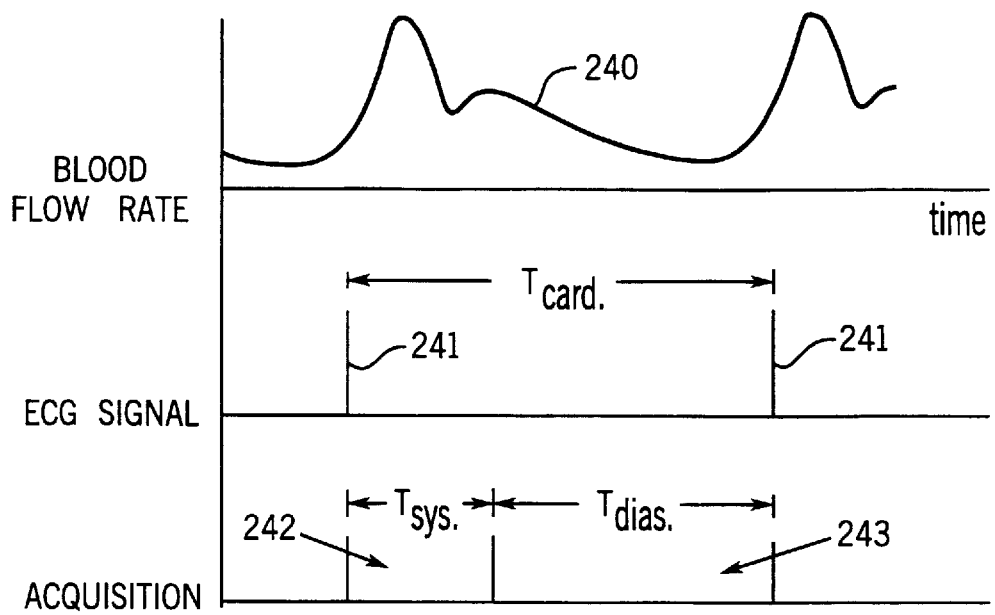
FIG. 4 is a graphic representation of how the data acquisition is synchronized with the subject's cardiac cycle.

Referring particularly to FIG. 4, the blood flow rate produced by the heart during a cardiac cycle is depicted by graph 240. An ECG signal 241 is produced at the beginning of each cardiac cycle and applied to the pulse generator module 121 of the MRI system as described above. The interval, $T_{card}$, between ECG trigger signals 241 is determined by the patient's heart rate and will vary considerably. Regardless of the heart rate, however, the first 300 msecs. of the cardiac cycle is characterized by a pulse of blood flow which produces the most rapid motion of the vessels being imaged. This "systolic phase" of the cardiac cycle defines a systolic acquisition window $T_{sys}$ which is exploited by the present invention. This systolic acquisition window is indicated at 242 in FIG. 4, and it is the normal practice when using cardiac gating to stop data acquisition during this period $T_{sys}$ because of the excessive motion.

The remainder of the cardiac cycle is referred to as the "diastolic phase" 243, and it is characterized by less drastic changes in blood vessel motion. It is during this cardiac phase that NMR data is usually acquired, because the blood vessels are relatively stationary. The duration of the diastolic phase 243 varies with the heart rate, but in the preferred embodiment a heart rate of 80 beats-per-minute is assumed ($T_{card}$=750 ms) and an acquisition window $T_{dias}$ is defined. A heart rate of 80 beats-per-minute is fast for a healthy individual, but it is typical of patients with either respiratory or cardiac disease.

It is a teaching of the present invention that during the systolic acquisition window $T_{sys}$ the views at the periphery of k-space should be acquired. During the diastolic acquisition window $T_{dias}$ when blood pulsatility and cardiac motion is minimal, the center of k-space is collected. This acquisition strategy is based on the hypothesis that image contrast is dominated by the center of k-space data and that, therefore, a relatively motion-artifact-free image can be collected if these data are collected during diastole. As shown in FIG. 5, the seven central k-space subregions A, $B_1$, $C_1$, $D_1$, $B_2$, $C_2$, and $D_2$ are acquired during the acquisition window $T_{dias}$, and the remaining eighteen peripheral k-space regions are acquired during the acquisition window $T_{sys}$. Using the pulse sequence of FIG. 3 (TR=7 ms) and the assumption of 80 beats-per-minute, 32 and 64 separate acquisitions, or views, can be acquired during the systolic 242 and diastolic 243 cardiac phases respectively.

Figure 6:
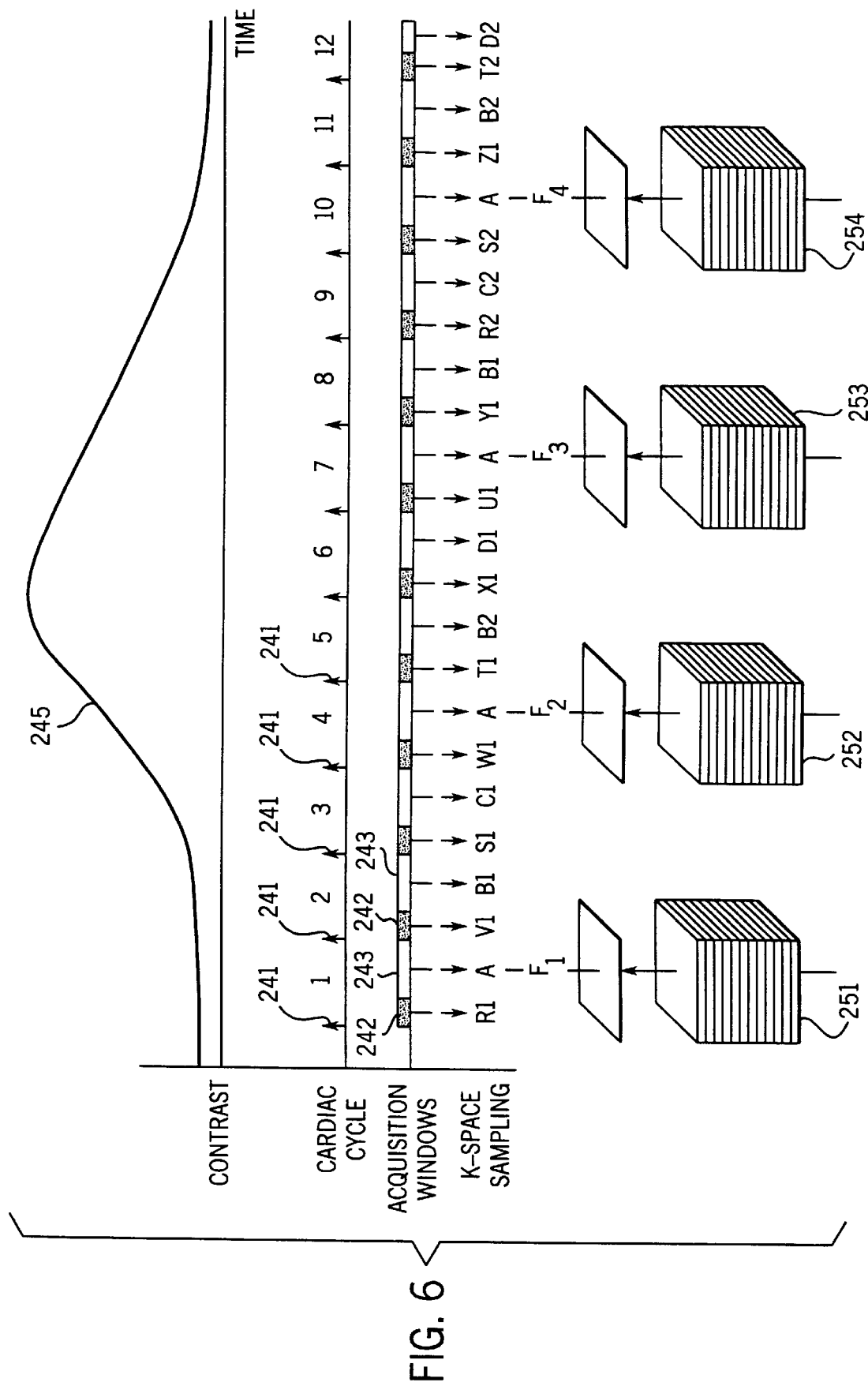
FIG. 6 is a graphic representation of the order in which the three-dimensional k-space of FIG. 5 is sampled during the dynamic study.

Reference is made to FIG. 6 which depicts a preferred acquisition method to be used during a dynamic study. Curve 245 depicts the contrast enhancement that is achieved by injecting the subject with a contrast agent. Twelve cardiac cycles are shown and indicated by the cardiac trigger signals 241. Thus, twelve interleaved systolic acquisition windows 242 and diastolic acquisition windows 243 are depicted.

The "A" k-space subregion is collected every third heart beat during the diastolic acquisition window 243. The $B_1$ and $B_2$ k-space subregions are also acquired during diastole every 6th heart beat, as are the remaining central subregions $C_1$, $C_2$, $D_1$, and $D_2$ which are acquired every 12th heart beat.

During the systolic acquisition windows 243 the peripheral k-space subregions $R_1$-$U_1$ and $R_2$-$U_2$ are acquired every 16th heart beat, and the k-space subregions $V_1$-$Z_1$ and $V_2$-$Z_2$ are acquired every 20th heart beat.

The data acquired during the dynamic study can be used in a number of ways to reconstruct a series of frame images $F_1$-$F_n$ that depict contrast changes occurring during the dynamic study. In the embodiment illustrated in FIG. 6, image frames designated $F_1$ through $F_4$ are reconstructed using data from each central k-space subregion A acquisition. This is accomplished by forming a data set sufficient to reconstruct a frame image using the central k-space subregion A data and combining it with temporally adjacent data from the surrounding central subregions B–D and surrounding, peripheral k-space regions R–Z. Each resulting image frame data set 251–254 depicts the subject at a particular time during the dynamic study, as determined by the time at which its central views were acquired.

One method for forming each such image frame data set is to use the data acquired from peripheral regions closest in time to the acquisition of the central k-space subregion A. This method of selecting the data closest in time to that of the image frame is referred to herein as the "nearest neighbor" method. It can be appreciated that sometimes the nearest data for a peripheral region of k-space is close to the frame time, and in other cases the frame time is midway between two sample periods.

Another method for forming a data set at each frame $F_1$ through $F_4$ is to interpolate between the data from two adjacent subregions. For example, in frame $F_2$ the k-space data for subregion $B_1$ may be computed by interpolating between the $B_1$ data acquired during the second and eighth cardiac cycles. A linear interpolation is used in the preferred embodiment, but a non-linear interpolation can also be used. For example, if a function indicative of the contrast curve 245 is known, this function can be used to weight the sampling done at different times during the study.

In the above-described method for forming data sets from which image frames can be reconstructed, one data set is formed for each sampling of the central subregion A of k-space. Additional image frames can be reconstructed, however, to further increase the temporal resolution of the dynamic study by further interpolation of the acquired data. One method is to simply interpolate between the complete data sets 251–254 formed as described above on a line-by-line basis.

Figure 7:
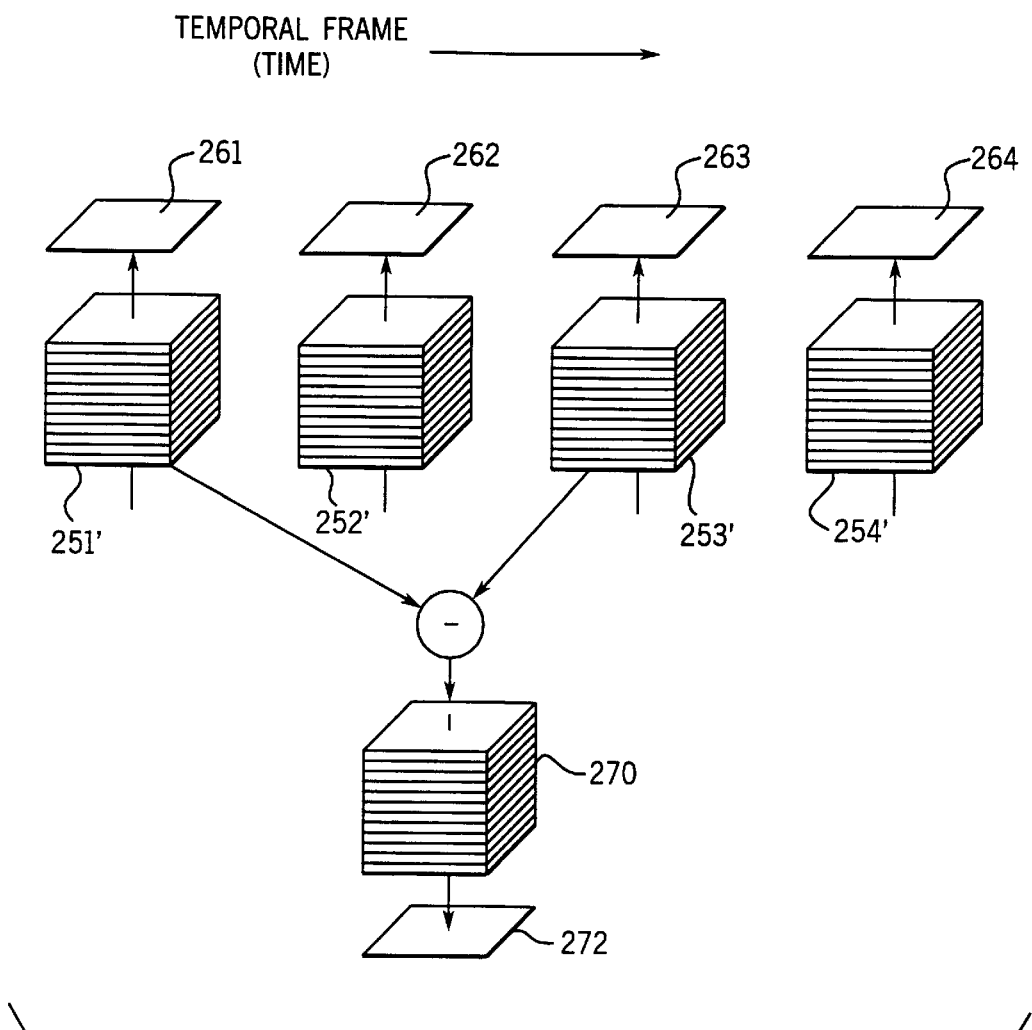
FIG. 7 is a pictorial representation of the data sets for each image frame in the dynamic study of FIG. 6, and how they are combined to produce an MRA image.

Regardless of how they are formed, the image frame data sets 251–254 are employed to reconstruct a corresponding set of 3D frame images 251'–254' shown in FIG. 7. In the preferred embodiment a three-dimensional Fourier transformation method is used to reconstruct each 3D frame image 251'–254'.

A number of different procedures can be used to produce useful diagnostic images from these frame image data sets 251'–254'. An image may be produced simply by selecting a set of data points located in a cross section through one of the 3D data arrays 251'–254'. Such images have limited diagnostic value, however, because blood vessels usually do not lie in a single plane and such cross sectional images show only short pieces or cross sections of many vessels that happen to pass through the selected plane. Such images are useful when a specific location in a specific vessel is to be examined, but they are less useful as a means for examining the health of the vascular system and identifying regions that may be diseased.

For assessing overall blood vessel structure and health it is more useful to project the 3D array of NMR data into a single 2D projection image to produce an angiogram-like picture of the vascular system. The most commonly used technique for doing this is to project a ray from each pixel in the projection image through the 3D array of data points and select the data point which has the maximum value. The value selected for each ray is used to control the brightness of its corresponding pixel in the projection image. This method, referred to hereinafter as the "maximum pixel technique," is very easy to implement and it gives aesthetically pleasing images. It is presently the preferred method.

Another technique which is used to form a projection image and which retains more of the available information is what is referred to hereinafter as the "integration method". This projection method is described in U.S. Pat. No. 5,204,627 entitled "Adaptive NMR Angiographic Projection Method" is used and is incorporated herein by reference. With this method the brightness of each projection image pixel is determined by the sum of all the data points along the projection ray.

Yet another technique used to produce projection images uses a 3D "region-growing" method. The origins of the regions in the 3D data set to be grown are operator determined. The grown regions are then blurred and thresholded to create a mask which includes voxels just outside the vessel edges, which may have been omitted in the region-growing process. This method gives a very smooth representation of the vasculature in which vessel edges are retained and vessel overlap can be deduced by use of visual cues which are included in the rendering process.

The 2D projection images from each 3D image frame data set 251'–254' is shown in FIG. 7 at 261–264. These may be viewed directly and used to observe the flow of contrast agent into the subject vasculature over the time course of the dynamic study. In some instances, one or more of the 2D projection images 261–264 may suffice to make a diagnosis.

If a definitive diagnosis cannot be made from the 2D projection images 261–264, a "difference" projection image can be produced to provide further diagnostic information. As shown in FIG. 7, this is achieved by selecting two of the 3D image frame data sets 251'–254' and calculating the difference between their corresponding pixel values. A 3D difference image is produced as indicated by data set 270 and this is then used to produce a 2D difference projection image 272 using the same projection method described above. The selection of two 3D image frame data sets 251'–254' is made by the diagnostician to enhance the image contrast in the particular vasculature of interest. Since it is difficult to predict exactly when the peak contrast agent flow will occur through the subject vasculature, the series of 3D image frames provides a time range during which this event should occur.

There are several reasons why image subtraction is useful. First any image artifacts that result from using the non-selective RF excitation pulse in the sequence shown in FIG. 3 are substantially the same in the two selected 3D image data sets. Thus, subtracting one image data set from another to produce a difference image substantially removes these image artifacts. Subtraction is also particularly beneficial when multiple injections of contrast agent are done. This causes the non-vascular background to become very bright later in the study, lowering vessel to background contrast. Subtraction of an early frame prior to vascular opacification will remove the background signal. Subtraction is also useful for creating additional opportunities to obtain images where veins and arteries display separately. Often a late frame, containing only veins, can be subtracted from an earlier frame in which the arterial signal is superimposed on the venous signal. This difference image is an arterial image.

When a temporal series of images is available, various matched filters and Eigen filters can be applied. A matched filter combines several of the images in the series to obtain an image containing improved signal to noise ratio. The images are weighted in the matched filter sum so as to maximize SNR. Eigen filters use a particular set of weighing coefficients such that venous signal is removed from the summed image. This technique requires the measurement of signal within a venous ROI to determine the required coefficients.

As explained above, the cardiac cycle is divided into a systolic period 242 and a diastolic period 243. As explained, the systolic period is fixed, and in the preferred embodiment it is fixed at 300 milliseconds. However, the duration of diastolic period varies considerably from patient to patient depending on heart rate, and it can vary considerably even during the dynamic study. One way to deal with this is to assume a worst case diastolic time period and fix $T_{dias}$ at some percentage (eg. 90%) of that interval. Such an approach insures that all the data is acquired in the sequence described above, but considerable time is unused in situations where the worst case conditions are not present.

Two alternative embodiments of the invention take advantage of the longer diastolic period presented by some patients. In the first alternative, a third time period $T_{ext.}$ is established after the fixed diastolic time period $T_{dias.}$. This third time period $T_{ext.}$ extends until the next cardiac trigger signal 241 occurs, and its duration may vary. During this variable time period $T_{ext.}$ a portion of central k-space may be acquired. For example, in heart beats where the central region A is acquired during $T_{dias.}$, data from either region $B_1$ or $B_2$ may be acquired during the extended time period $T_{ext.}$. During heartbeats in which the central regions $B_1$ or $B_2$ or $C_1$ or $C_2$ are acquired in the time period $T_{dias.}$, data from the central region A may be acquired $T_{ext.}$. For an individual with a fairly constant heart rate, this acquisition strategy enables the central regions (A) of k-space to be updated every heart beat. In the alternative, the extended time period $T_{ext.}$ may be used to acquire data from regions of k-space that are normally "zero-filled".

A second alternative embodiment of the invention requires an adaptive acquisition during the diastolic time period. Data is acquired in the order indicated in FIG. 6. The systolic period $T_{sys.}$ is fixed, but the diastolic period $T_{dias.}$ is allowed to continue until the next cardiac trigger signal 241 occurs. Data is continuously acquired during diastole and the sequence is adapted each cardiac cycle by retrospectively determining what was acquired during previous cardiac cycles. If, for example, a heart beat was significantly reduced and only 75% of the data in the A-region were collected, then during the diastolic acquisition window of the next heart beat, the remainder of region A would be acquired prior to collecting the next region (e.g. $B_1$ in the case of the acquisition scheme of FIG. 6).

We claim:

1. A method for acquiring NMR data from a subject after injection of a contrast agent to produce a series of frame images depicting the passage of contrast agent through a region of interest in the subject by repeatedly acquiring samples from a corresponding k-space during a dynamic study of the subject, the steps comprising:

producing a signal indicative of the cardiac cycle of the subject and defining in each cardiac cycle a systolic acquisition window and a diastolic acquisition window;

sampling during the dynamic study a central region of the k-space during the diastolic acquisition window at a selected temporal rate to produce a set of central region k-space samples;

sampling during the dynamic study peripheral regions of the k-space during the systolic acquisition window at a lower temporal rate to produce peripheral samples;

producing a series of data sets by forming a data set for each set of central region k-space samples, which includes said set of central region k-space samples and samples derived from temporally adjacent peripheral samples; and reconstructing the series of frame images from the series of data sets.

2. The method as recited in claim 1 in which the NMR data is acquired from a three-dimensional region of the subject.

3. The method as recited in claim 2 in which the frame image is a three-dimensional frame image.

4. The method as recited in claim 3 in which a two-dimensional image is produced by projecting the three-dimensional frame image.

5. The method as recited in claim 3 in which a plurality of three-dimensional frame images are reconstructed from said formed data sets, and a further three-dimensional image is produced by subtracting one of said three-dimensional frame images from another one of said three-dimensional frame images.

6. The method as recited in claim 5 in which a two-dimensional image is produced by projecting the further three-dimensional image.

7. The method as recited in claim 1 in which the samples derived from the temporally adjacent peripheral samples are derived by selecting the temporally nearest peripheral samples of the peripheral k-space regions.

8. The method as recited in claim 1 in which the samples derived from the temporally adjacent peripheral samples are derived by interpolating between the two temporally nearest peripheral samples of the peripheral k-space regions.

9. The method as recited in claim 8 in which the interpolation is linear interpolation.

10. The method as recited in claim 1 in which said central region of the selected k-space is divided into subregions, and at least one of said subregions is sampled during the diastolic acquisition window of each successive cardiac cycle.

11. The method as recited in claim 10 in which some of said subregions are sampled at a different temporal rate than other of said subregions.

12. The method as recited in claim 1 in which said peripheral region of the selected k-space is divided into subregions and at least one of said subregions is sampled during the systolic acquisition window of each successive cardiac cycle.

13. The method as recited in claim 12 in which some of said subregions are sampled at a different temporal rate than other of said subregions.

* * * * *